United States Patent [19]

Dill et al.

[11] Patent Number: 4,838,952

[45] Date of Patent: Jun. 13, 1989

[54] CONTROLLED REFLECTANCE SOLAR CELL

[75] Inventors: Hans G. Dill, San Marcos; David R. Lillington, Van Nuys, both of Calif.

[73] Assignee: Spectrolab, Inc., Sylmar, Calif.

[21] Appl. No.: 188,505

[22] Filed: Apr. 29, 1988

[51] Int. Cl.⁴ .................. H01L 31/06; H01L 31/18
[52] U.S. Cl. ........................ 136/256; 437/2; 357/30
[58] Field of Search .............. 136/256; 437/2; 357/30 J, 30 Q

[56] References Cited

FOREIGN PATENT DOCUMENTS 59-150482  8/1984  Japan .................................. 136/256

OTHER PUBLICATIONS

R. N. Hall et al, "Polka Dot Solar Cell", *Conf. Record, 14th Photovoltaic Specialists Conf.* (1980), pp. 550-553.

R. A. Sinton et al., "Silicon Point Contact Concentrator Solar Cells", *Proc. 18th IEEE PVSC*, 1985, pp. 61-65.

*Primary Examiner*—Aaron Weisstuch
*Attorney, Agent, or Firm*—Terje Gudmestad; A. W. Karambelas

[57] ABSTRACT

A solar cell is disclosed wherein both the emitter and the base electrical contacts for a solar cell are disposed on the back major surface. Holes extend through the back major surface and the base layer to the emitter layer. The walls of the holes are doped to the same conductivity as the front emitter layer. Emitter contacts are deposited on the back major surface of the cell and extend into the holes making electrical contact to the emitter layer for collecting light generated current carriers. The base contacts are also disposed on the back major surface, and antireflection coatings are deposited on the emitter front major layer. Consequently, the front of the solar cell can be made smooth and therefore, a specularly reflective (non-scattering) solar cell results.

22 Claims, 2 Drawing Sheets

CONTROLLED REFLECTANCE SOLAR CELL

BACKGROUND OF THE INVENTION

1. Field of Invention

The present invention relates in general to solar cells, and more particularly, to solar cells having smooth front surfaces and both n-type and p-type electrical contacts on the backside of the cells.

2. Description of Related Art

Conventional solar cells consist of a semiconductor body having a p-type semiconductor layer, an n-type conductivity layer, an n-p or p-n semiconductor junction between these layers, a front light-receiving major surface and a back major surface. The layer adjacent to the front surface is called the emitter, and the layer adjacent to the back surface is called the base. When light energy impinges on the front light receiving surface of the cell, electrons and corresponding holes are created in both the emitter and base. For the most part, because of the presence of the semiconductor junction, electrons will be directed toward one major surface of the cell and holes toward the other major surface, resulting in a photo current density. In a typical n-p silicon semiconductor junction solar cell, electrons move to the front light receiving surface of the cell and holes toward the back surface. Typically electrical contacts are attached to the front and back surfaces of the silicon semiconductor body to collect the charge carriers. The holes are collected by the back electrical contact and electrons by the front electrical contact. In certain applications, however it is desirable that solar cells have a perfectly smooth front light receiving surface from which minimal light scatter occurs called a specular surface.

A silicon concentrator cell which has a front surface without contacts has been disclosed in an article by Sinton, Kwark, Gruenabaum & Swanson, entitled "Silicon Point Contact Concentrator Solar Cells," *Proc. 18th IEEE Photovoltaic Specialists' Conference*, 61–65 (1985). The front surface of the semiconductor body of the solar cell is passivated with a layer of oxide, which mitigates front surface recombination. At the backside of the semiconductor body, are disposed a plurality of p+- and n+-type conductivity regions. Both n+ and p+ electrical contacts are disposed on the back surface of the semiconductor body making contact to these regions, respectively. In operation, sunlight hits the front major light receiving surface of the solar cell generating electron-hole pairs, near the front surface. These carriers must drift as much as about 80 to 240 microns to the back surface of the cell to be collected by the electrical contacts and thereby provide useful power current. During the lifetime of the solar cell, and especially in space applications, radiation rapidly degrades this solar cell and consequently the carrier lifetime of the electrons and holes, such that fewer and fewer electrons are able to reach the back n+ contact before recombining. Therefore, efficiency of the solar cell greatly decreases over time.

SUMMARY OF THE INVENTION

It is therefore an object of this invention to provide a solar cell which is scatters a minimal amount of light from the front surface but is still highly efficient and highly resistant to radiation damage.

It is a feature of this invention to have emitter contacts on the back surface of the solar cell which extend through the back base layer to a front emitter layer which reduces the distance current carriers must travel within the semiconductor body before being collected by the electrical contacts.

It is an advantage of this invention that when the solar cell is hit by radiation, any degradation to the semiconductor material will far less rapidly degrade the efficiency of the solar cell than other back contact solar cells in prior art constructions.

A solar cell arrangement according to the present invention includes a semiconductor body having at least two adjacent impurity doped semiconductor layers of opposite conductivity type forming the emitter and base layers of a solar cell, respectively, with a semiconductor junction therebetween. The emitter and base layers have front and back major essentially parallel surfaces, respectively. An oxide layer is disposed on the front major light receiving surface of the semiconductor body. Both electrical contacts are disposed on the back major surface. One of these contacts makes direct electrical contact to the base layer. The other electrical contact sits on an insulating layer which electrically separates it from the base layer and extends through small openings in the base layer to make electrical contact to the emitter layer. The walls of the small openings may be doped to the same conductivity type as the emitter layer.

Other and further objects, advantages, and characteristic features of the present invention will become apparent from the following detailed description of preferred embodiments of the invention when taken in conjunction with the appended drawings.

DESCRIPTION OF THE PREFERRED EMBODIMENTS

Figure 1:
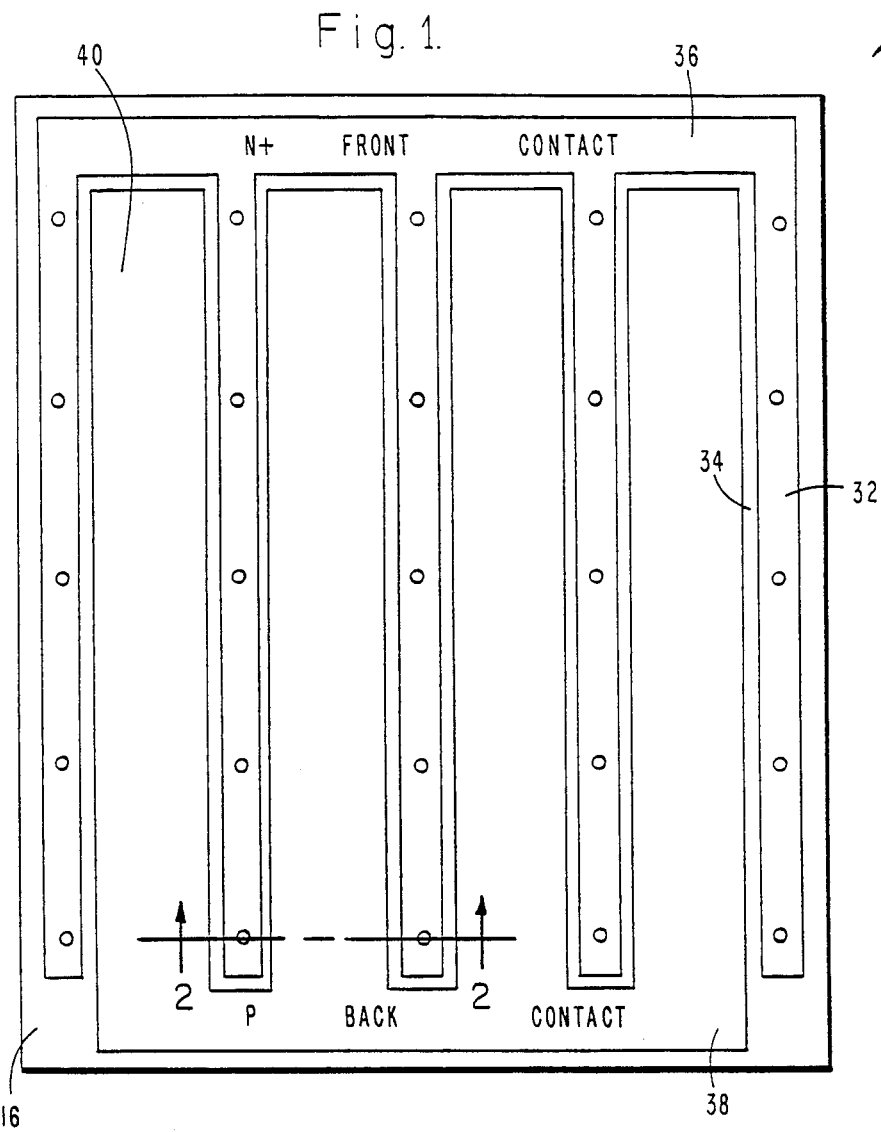
FIG. 1 is a plan view of the back of a solar cell according to the principles of the invention.
Figure 2:
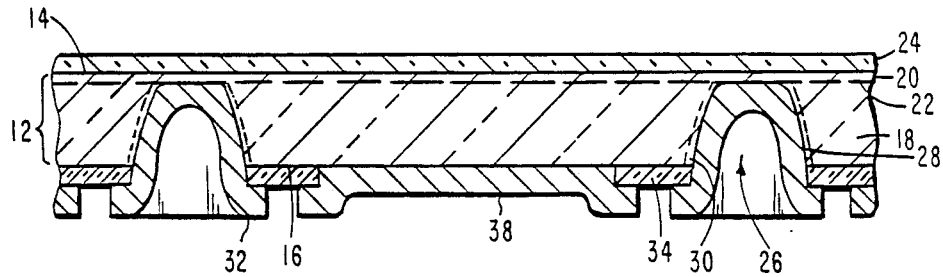
FIG. 2 is a cross-sectional view taken along line 2—2 of FIG. 1.

Referring now, with greater particularity to FIGS. 1 and 2, a solar cell 10 is shown having a semiconductor body 12 with front and back major parallel surfaces 14 and 16. The semiconductor body 10 includes a back base layer 18 which may be silicon, although III–V semiconductor materials may be used instead, such as GaAs, AlGaAs or InP, for example. The base layer 18 may be impurity doped to a p-type conductivity, for example. The semiconductor body 10 further includes a front emitter layer 20 overlying the base layer 18 which may be impurity doped to an n+-type conductivity, for example. An n+-p junction 22 lies between the emitter and base layers, 20 and 18. Overlying the emitter layer 20 is an anti-reflection coating 24 which may be a layer of silicon nitride, aluminum oxide, or silicon oxide, for example. Although an n+-p semiconductor body is discussed and illustrated a p+-n semiconductor body may also be used where the base layer 18 is of an n-type conductivity, and the emitter layer 20 is of p+-type conductivity.

A plurality of openings 26 which the recesses extend through the back major surface 16 and base layer 18 to the emitter layer 20. The openings 26 may be arranged in rows and columns, however, other desired spacings may also be used. The openings 26 typically may be about b 5-10 mils in diameter and spaced apart by approximately 100 mils, for example. A thin n+ layer 28 extends along the walls 30 of the openings 26 from the back major surface 16 to the emitter layer 20.

A plurality of essentially parallel emitter metal contact lines 32 are disposed on the back major surface 16 traversing openings 26. These contact lines 32 extend into the openings 26 and make electrical contact to the front emitter layer 20. The emitter contact lines 32 are spaced from the base layer 18 by a nonconductive layer 34 which is disposed on the back major surface 16. The emitter contact lines 32 may be connected together near the edge of the cell by a flat metal strip 36 which extends across the back major surface 16 and is intersected by contact lines 32.

A base contact 38 is disposed on the back major surface 16 making an electrical contact to the p-type conductivity layer 18. Base contact 38 consists of a plurality of wide metal strips 40 which are interdigitatedly disposed between emitter contact lines 32.

Accordingly, a solar cell 10 is described above in which there are no electrical contacts on the front major light receiving surface. The front light receiving surface therefore can be made specular. Moreover, solar cells emboding the invention may be fabricated by relatively low cost, high yield processes.

Figure 3:
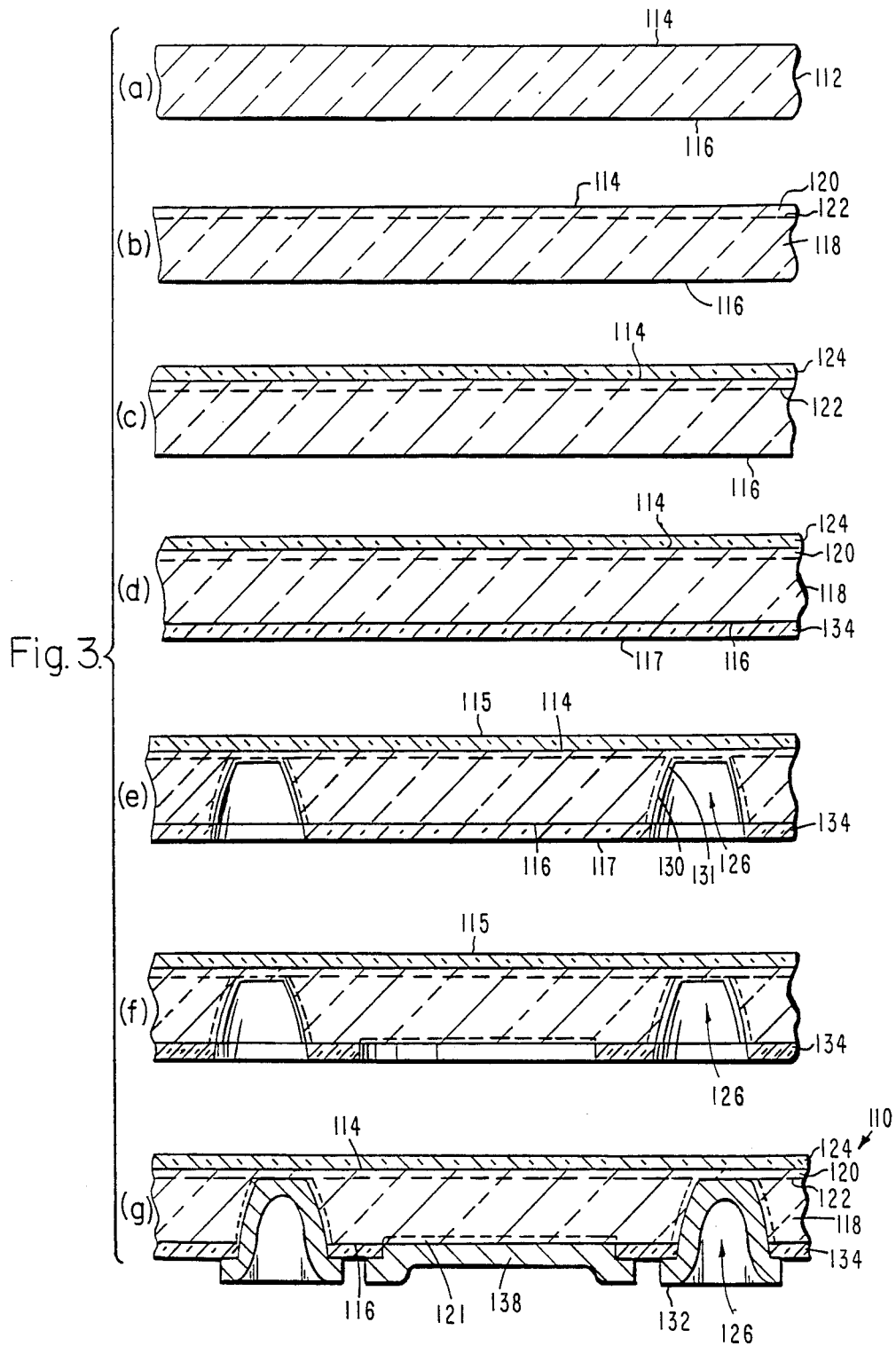
FIGS. 3a–g are respective cross-sectional views of a preferred process sequence for fabricating a solar cell.

A solar cell 110 can be fabricated according to a preferred method as illustrated in FIG. 3. Components in the embodiment of FIG. 3 which are the same as or equivalent to respective components in the embodiment of FIGS. 1 and 2 are designated by the same second and third reference numeral digits as their corresponding components in FIGS. 1 and 2 along with the addition of a prefix "1". As illustrated in FIG. 3a, beginning with a wafer of silicon, for example, wafer 112 has front and back major essentially parallel surfaces 114 and 116 respectively, and may contain a sufficient concentration of impurities to initially possess a uniform conductivity of p-type.

Wafer 112 is transferred to a suitable diffusion furnace (not shown) where n-type diffusion is carried out using phosphine gas PH$_3$ or POCl$_3$, at approximately 800° C. and a nitrogen carrier to produce a shallow n+-p junction 122 on the order of 0.1 to 0.5 microns in depth, as shown in FIG. 5b. An n+ type front layer 120 is also formed. Alternatively, the n-type layer 120 may be formed by ion implantation or any other of the well known techniques for producing the n+ layer, such as laser induced or electron beam induced diffusion, from a liquid, solid, or gaseous source. As is known in the art, the collection efficiency of the solar cell is related to the depth of the n+-p junction. A discussion of this relationship may be found, for example, in "Fundamentals of Solar Cells: Photovoltaic Solar Energy Conversion" by Alan L. Fahrenbruch and Richard H. Bube, Academic Press, N.Y., 1983, incorporated herein by reference. Diffused n+-p junctions are also described in "Physics and Technology of Semiconductor Devices" by A. S. Grove (John Wiley & Sons, 1967), which is incorporated herein by reference.

With the n+-p junction 122 in place, the wafer is transferred to a conventional low pressure chemical vapor deposition (CVD) station (not shown) wherein a thin layer 124 of silicon nitride, Si$_3$N$_4$, is deposited covering the front major surface as shown in FIG. 3c, to a thickness typically on the order of 0.6 to 1.0 micron. Low temperature chemical deposition processes used for forming thin oxide nitride layers are generally well known in the art and are discussed, for example, a Part III of "Thin Film Processes" by Vossen & Kern (Academic Press, N.Y., 1978) at pages 258-320, which is incorporated herein by reference. The nitride layer 124 serves as an anti-reflection coating and also as a mechanical support or backing for the n+ layer 120. Alternatively, indium tin oxide, ITO, may be used. Indium tin oxide increases the conductivity of the emitter layer so the openings, described below, may be spaced further apart.

Next, a dielectric layer 134 which may be silicon oxide, silicon nitride, or aluminum oxide, for example, is deposited over the back major surface to a thickness typically on the order of 1 micron, as shown in FIG. 3d. Chemical vapor deposition or low pressure chemical vapor deposition techniques generally well known in the art may be employed as described above.

The structure of FIG. 3d is transfered to a conventional photoresist deposition and mask forming station (not shown) where an outer photoresist mask is formed over the back major surface 117 of oxide layer 134. The formation of photoresist masks is well known in the art, and such masks are described, for example, by William S. DeForest in "Photoresist: Materials and Processes" (McGraw-Hill, 1975). Thereafter, the photoresist mask is exposed, leaving openings through to the back major surface 116 in the desired pattern for openings. Using a suitable etchant, such as, for example, hydrofluoric acid, (HF)/Nitric acid (HNO$_3$)/acetic acid (CH$_3$COOH), portions of oxide layer 134 are etched away and also portions of base layer 118 thereunder to the n+-p junction 122, as shown in FIG. 3e. The etchant is selected such that etching will stop at the higher doped material, namely the emitter n+ conductivity type layer. After the openings 126 have been formed, the remaining photoresist is lifted off using suitable organic solvents.

Thereafter, a mask (not shown) is applied to the entire front surface 115 which may be silicon oxide, for example. The silicon oxide mask may be deposited using generally known chemical vapor deposition to niques as described above. Then an n-type dopant such as phosphorus is diffused into the walls of the openings 126 to a depth of about 0.5 to 1.0 micron, for example, as shown in FIG. 3e. The method of applying the dopant can be by electron beam, thermal evaporation, or chemical vapor deposition using a liquid, solid of gaseous source The dopant could also be implanted using an ion beam source. The n-type dopant may also be thermally diffused into the walls 130 of the openings 126 using a laser, infrared source, or heating source. In the diffusing process, a thin layer o phospho-silicate (n) or borosilicate (p) glass 31 is formed on the walls 130 of openings 126, which thin layer serves as a mask in subsequent processing steps.

Wafer 112 is again transfered to a conventional photoresist deposition and mask forming station (not shown) where another photoresist mask is formed of the back major surface 117. The photoresist mask on the back surface 117 is exposed, leaving openings therethrough to the back major surface 116 and the desired pattern for the back P contact. As shown in FIG. 3f, the oxide layer 134 in the open areas is etched away using a suitable etchant such as hydrofluoric acid (HF). In an optional step, a thin p+ layer 121 may be formed under the back major surface and the open areas by diffusing or implanting a p-type dopant such as boron, aluminum, or gallium. A cost effective and reliable method of making the shallow p+ layer is disclosed in an article written by Gillanders, Mardesich and Garlick, entitled "Low Alpha, Boron, BSF Solar Cell", 17th IEEE Photovoltaic Specialist's Conference, 128–143 (1984), which is incorporated herein by reference. The shallow p+ layer 121 may be about 1 micron thick, for example. For some applications, in high radiation orbits over the Earth, the use of a p+ layer 121 is not required, nor is it desirable. The presence or absence of this p+ layer is immaterial to the spirit of this invention. The photoresist mask is thereafter removed.

Next, another photoresist mask is applied to the back surface of the wafer. The photoresist mask is exposed, leaving openings therethrough to the back major surface 116 in the desired pattern for the n+ front contact 132 and p+ back contact 138. Alternatively, the the photoresist mask above could be used in metal deposition step.

With the photoresist mask firmly in place, the wafer is transfered to a suitable multilayer metal deposition station (not shown) where a thin multilayer metal film is deposited on the back surface to form metallized structure of FIG. 3g. Then, using conventional photoresist lift-off techniques, the photoresist mask is removed by soaking the wafer in a suitable solvent to thereby carry away portions of the metalization lying thereover, leaving metalization as shown in FIG. 3g. The metal contacts of the completed solar cell structure of FIG. 3g are preferably titanium-palladium-silver with titanium being the initial or surface layer up about 500 Å in thickness, palladium being the next or middle layer of approximately 800 Å in thickness, and the upper layer being of silver of 5 microns in thickness. For a further discussion of multiple element metalization systems of the above type, reference may be made to Fischer and Gereth, *Transactions on Electron Devices*, Vol. ED-18, No. 8, page 457 (August 1978), which is incorporated herein by reference.

Following depositing of the metalization, the electrical contacts are sintered and the wafer cut to the desired size and shape.

Various modifications may be made to the abovedescribed embodiments without departing from the scope of the invention. Thus, although the present invention has been shown and described with reference to particular embodiments, nevertheless, various modifications and changes obvious to one skilled in the art are deemed to be within the spirit, scope and contemplation of the invention, as set forth in the appended claims.

What is claimed is:

1. A solar cell comprising:
    A semiconductor body having a front layer of a first conductivity type and an adjacent back layer of a second conductivity type opposite of said first conductivity type, said front and back layers forming front and back major surfaces, respectively said semiconductor body further having a plurality of openings through said back major surface and back layer which form recesses extending to said front layer, said recesses having walls which are doped to said first conductivity type;
    a first electrical contact disposed in said recesses making electrical contact to said first conductivity type layer; and
    a second electrical contact disposed on said back major surface making electrical contact to said second conductivity type layer.

2. A solar cell as defined in claim 1, wherein said first conductivity type is p+ and said second conductivity type is n.

3. A solar cell as defined in claim 1, wherein said first conductivity type is n+ and said second conductivity type is p.

4. A solar cell as defined in claim 1, further comprising a layer of nonconductive material disposed on said back major surface to electrically separate said first electrical contact from said second conductivity type layer.

5. A solar cell as defined in claim 4, further comprising at least one antireflection coating disposed on said front major surface.

6. A solar cell as defined in claim 5, wherein said openings are arranged in rows and columns.

7. A solar cell as defined in claim 5, wherein said antireflection coating is silicon oxide.

8. A solar cell as defined in claim 5, wherein said antireflection coating is indium tin oxide.

9. A solar cell as defined in claim 5, wherein said antireflection coating is silicon nitride.

10. A solar cell as defined in claim 5, wherein said antireflective coating is aluminum oxide.

11. A solar cell as defined in claim 1, further including a thin p+ layer under said second electrical contact.

12. A solar cell comprising:
    a semiconductor body having an n-type conductivity layer and an adjacent p-type conductivity layer, front and back major surfaces, respectively, and an n-p junction between said layers, said semiconductor body further having a plurality of openings through said back major surface which form recesses extending up to said n-p junction, the interior wall surfaces of said recesses having a thin layer of n-type semiconductor material disposed therein;
    a p-type electrical contact disposed on said back major surface;
    an insulator layer disposed on a portion of said back major surface adjacent said openings;
    an n-type electrical contact disposed on said n-type semiconductor material in said recesses, said n-type electrical contact being separated from said p-type semiconductor material by said insulator layer.

13. A solar cell as defined in claim 12, further comprising at least one antireflection coating disposed on said front major surface.

14. A solar cell as defined in claim 13, wherein said openings are arranged in rows and columns.

15. A solar cell as defined in claim 14, wherein said n-type electrical contact includes a plurality of metal fingers crossing said openings.

16. A solar cell as defined in claim 15, wherein said p-type electrical contact includes a plurality of metal fingers interdigitatedly disposed between said n-type electrical contacts.

17. A solar cell comprising:
    a semiconductor body having a p-type conductivity layer and an adjacent n-type conductivity layer, front and back major surfaces, respectively, and a p-n junction between said layers, said semiconductor body further having a plurality of openings through said back major surface which form recesses extending up to said p-n junction, the interior wall surfaces of said recesses having a thin layer of p-type semiconductor material disposed thereon;
    an n-type electrical contact disposed on said back major surface;

an insulator layer disposed on a portion of said back major surface adjacent said openings;

a p-type electrical contact disposed on said p-type semiconductor material in said recesses, said p-type electrical contact being separated from said n-type semiconductor material by said insulator layer.

18. A solar cell as defined in claim 17, further comprising at least one antireflection coating.

19. A solar cell as defined in claim 18, wherein said openings are arranged in rows and columns.

20. A solar cell as defined in claim 19, wherein said p-type electrical contact includes a plurality of metal fingers crossing said openings.

21. A solar cell as defined in claim 20, wherein said n-type electrical contact includes a plurality of metal fingers interdigitatedly disposed between said p-type electrical contacts.

22. A method of fabricating a solar cell, comprising the steps of:

providing a wafer of semiconductor material of a first conductivity having front and back essentially parallel major surfaces;

forming a second conductivity layer under said front major surface of said wafer thereby defining a p-n junction between said first and second conductivity layer in a plane essentially parallel to said front and back major surfaces;

depositing an antireflection coating on said front major surface;

depositing a layer of nonconductive material on said back major surface;

forming a plurality of openings in said wafer which form recesses extending through said layer of insulating material and said back major surface up to said p-n junction;

diffusing a dopant of said second conductivity type in the walls of said recesses to form a thin layer of semiconductor material doped to a second conductivity type;

depositing metallization on said back major surface to form a plurality of contacts including an electrical contact on said back major surface to said first conductivity semiconductor material and a contact to said second conductivity layer and said openings.

* * * * *